United States Patent
Watatani (10) Patent No.: US 6,337,519 B1
(45) Date of Patent: Jan. 8, 2002

(54) SEMICONDUCTOR DEVICE HAVING A MULTILAYERED INTERCONNECTION STRUCTURE

(75) Inventor: Hirofumi Watatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/662,318

(22) Filed: Sep. 14, 2000

Related U.S. Application Data (62) Division of application No. 09/344,241, filed on Jun. 25, 1999, now Pat. No. 6,153,511.

(30) Foreign Application Priority Data

Oct. 14, 1998 (JP) ............................................ 10-292515

(51) Int. Cl.[7] ............................................... H01L 23/48
(52) U.S. Cl. ...................................... 257/759; 257/760
(58) Field of Search ................................. 257/752, 758, 257/759, 760

(56) References Cited

U.S. PATENT DOCUMENTS

| | | | |
|---|---|---|---|
| 5,381,046 A | * 1/1995 | Cederbaum et al. | 257/760 |
| 5,539,255 A | 7/1996 | Cronin | 257/750 |
| 5,635,423 A | 6/1997 | Huang et al. | 438/638 |
| 5,663,101 A | 9/1997 | Cronin | 438/637 |
| 5,877,075 A | 3/1999 | Dai et al. | 438/597 |
| 5,882,996 A | 3/1999 | Dai | 438/597 |
| 5,916,823 A | 6/1999 | Lou et al. | 438/738 |
| 5,935,762 A | 8/1999 | Dai et al. | 430/312 |
| 5,960,254 A | 9/1999 | Cronin | 438/14 |
| 5,981,377 A | * 11/1999 | Koyama | 438/633 |
| 6,051,508 A | 4/2000 | Takase et al. | 438/724 |
| 6,054,379 A | 4/2000 | Yau et al. | 438/623 |
| 6,060,380 A | 5/2000 | Subramanian et al. | 438/618 |
| 6,071,809 A | 6/2000 | Zhao | 438/634 |
| 6,072,227 A | 6/2000 | Yau et al. | 257/642 |
| 6,074,942 A | 6/2000 | Lou | 438/632 |
| 6,144,099 A | * 11/2000 | Lopatin et al. | 257/758 |
| 6,265,779 B1 | * 7/2001 | Grill et al. | 257/759 |
| 6,265,780 B1 | * 7/2001 | Yew et al. | 257/759 |

* cited by examiner

*Primary Examiner*—T. N. Quach
(74) *Attorney, Agent, or Firm*—Armstrong, Westerman, Hattori, McLeland & Naughton, LLP (57) ABSTRACT

A semiconductor device has a multilayer interconnection structure including a lower organic interlayer insulation film, an etching stopper film on the lower interlayer insulation film and an upper organic interlayer insulation film covering the etching stopper film, wherein the upper organic interlayer insulation film is covered by first and second etching stopper films of respective, different compositions.

3 Claims, 12 Drawing Sheets

SEMICONDUCTOR DEVICE HAVING A MULTILAYERED INTERCONNECTION STRUCTURE

This application is a division of prior application Ser. No.09/344,241 filed Jun. 25, 1999, U.S. Pat. No. 6,153,511.

BACKGROUND OF THE INVENTION

The present invention generally relates to semiconductor devices and more particularly to a semiconductor device having a multilayer interconnection structure and a fabrication process thereof.

With the progress in the art of photolithography, integration density of integrated circuits is increasing continuously every year, and the number of active devices formed on a common semiconductor chip is increasing ever and ever.

In order to interconnect such active devices formed on a single semiconductor chip, recent integrated circuits tend to use a multilayer interconnection structure in which conductor patterns are covered by an interlayer insulation film and the conductor pattern of the next layer is formed on the foregoing interlayer insulation film. By repeating such a structure, it is possible to provide a complex wiring pattern for the active devices formed on the semiconductor chip.

On the other hand, such a continuous increase of integration density has raised the problem of transmission delay of signals caused inside the integrated circuit as a result of the resistance and capacitance of the complex interconnection patterns formed in the multilayer interconnection structure. Thus, in order to minimize the problem of signal transmission delay as much as possible, recent integrated circuits tend to use a low-resistance Cu pattern in a multilayer interconnection structure, in combination with an organic interlayer insulation film characterized by a low-dielectric constant.

In view of the difficulty of patterning a Cu layer by a conventional dry etching process, such a multilayer interconnection structure that uses a Cu interconnection pattern is generally formed according to the dual damascene process in which interconnection grooves and contact holes are formed first in an interlayer insulation film in correspondence to the desired interconnection pattern, followed by the deposition process of a Cu layer such that the Cu layer thus deposited fills the interconnection grooves and the contact holes. After the deposition of the Cu layer, a chemical mechanical polishing (CMP) process is applied and the part of the Cu layer located above the interlayer insulation film is polished away. Thereby, a planarized structure suitable for forming a second interconnection layer thereon is obtained easily.

It should be noted that the foregoing dual damascene process, not relying on the dry etching process for forming a conductor pattern, is advantageous in forming the interconnection patterns with a large aspect ratio. Further, the dual damascene process successfully overcomes the difficulty of covering the conductor patterns repeated with a minute pitch by means of an interlayer insulation film. Thus, dual damascene process is thought to be an advantageous process of forming a multilayer interconnection structure including therein extremely minute conductor patterns. The foregoing effect of the dual damascene process for reducing the cost of the semiconductor device is particularly significant for the semiconductor devices in which the interconnection pattern of the multilayer interconnection structure has an increased aspect ratio and formed with a decreased pitch.

FIGS. 1A–1F show a typical example of the conventional dual damascene process of forming a multilayer interconnection structure that uses an $SiO_2$ interlayer insulation film.

Figure 1A:
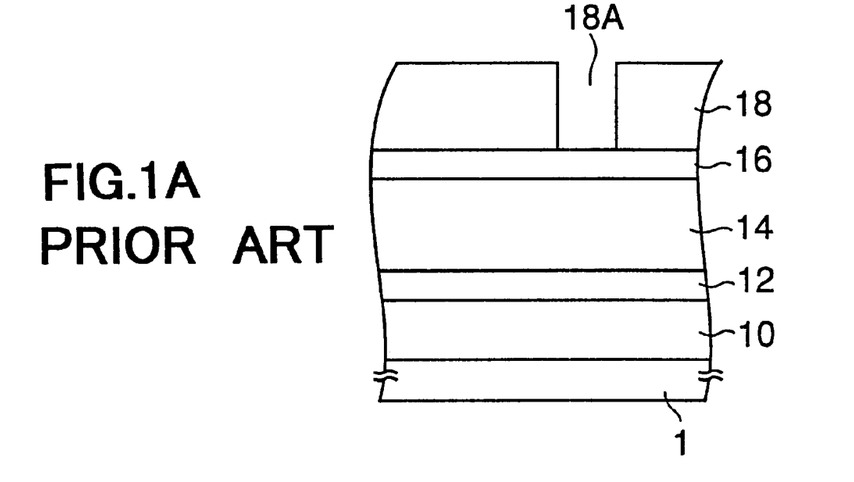
FIGS. 1A–1F are diagrams showing an example of conventional dual damascene process.

Referring to FIG. 1A, a substrate 1 of Si carries thereon a lower interconnection pattern 10 of a conductive material such as Cu, with an insulation film (not illustrated) interposed between the Si substrate 1 and the lower interconnection pattern 10. Further, a first etching stopper film 12 of SiN is formed on the lower interconnection pattern 10 by way of a plasma CVD process, and a first interlayer insulation film 14 of $SiO_2$ is formed further on the etching stopper film 12 by a plasma CVD process. The first interlayer insulation film 14 is then covered by a second etching stopper film 16 of SiN formed by a plasma CVD process, and the second etching stopper film 16 is covered by a resist pattern 18, wherein the resist pattern 18 includes a resist window 18A formed in correspondence to the contact hole to be formed in the multilayer interconnection structure.

Figure 1B:
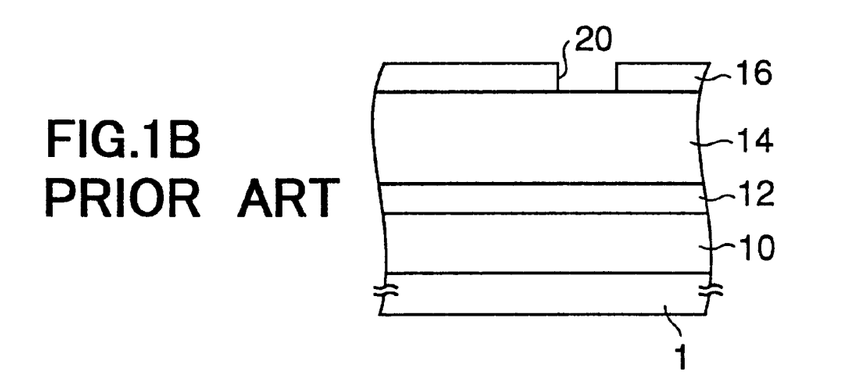

Next, in the step of FIG. 1B, a dry etching process is applied to the SiN film 16 while using the resist pattern 18 as a mask, and there is formed an opening 20 in the SiN film 16 in correspondence to the resist window 18A. After the formation of the opening 20, the resist pattern 18 is removed by an ashing process.

Figure 1C:
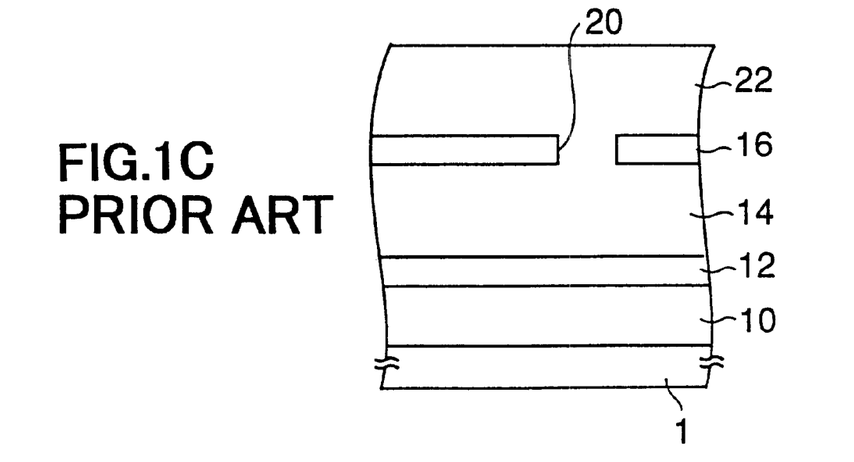
Figure 1D:
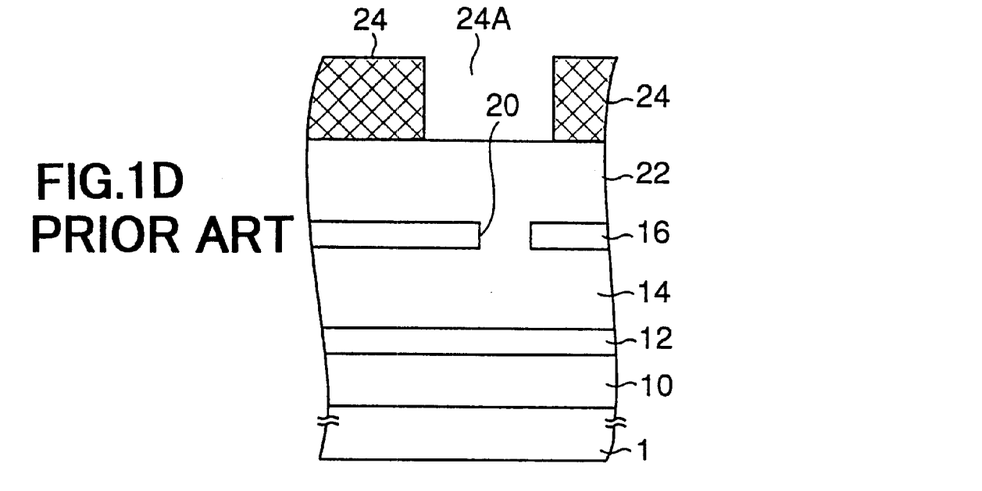

Next, in the step of FIG. 1C, an $SiO_2$ film 22 is formed on the SiN film 16 by a CVD process as a second interlayer insulation film such that the second interlayer insulation film 22 covers the foregoing opening 20, and a step of FIG. 1D is conducted subsequently in which a resist pattern 24 having a resist window 24A corresponding to the interconnection groove to be formed in the $SiO_2$ film 22, is provided on the $SiO_2$ film 22.

Figure 1E:
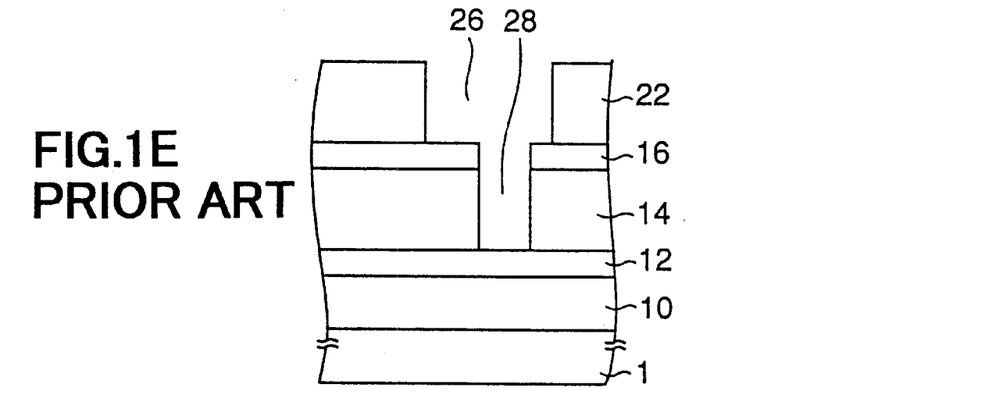

Next, in the step of FIG. 1E, the $SiO_2$ film 22 is subjected to a dry etching process while using the resist film 24 as a mask, to form an interconnection groove 26 in the $SiO_2$ film in correspondence to the resist window 24A of the resist pattern 24. It should be noted that the interconnection groove 26 exposes the SiN film 16 at the bottom surface thereof.

By continuing the dry etching process of FIG. 1E further after the exposure of the SiN film 16 in the interconnection groove 26, the dry etching proceeds into the $SiO_2$ film 14 and there is formed a contact hole 28 in the $SiO_2$ film 14. The contact hole 28 exposes the SiN film 12 at the bottom part thereof.

Figure 1F:
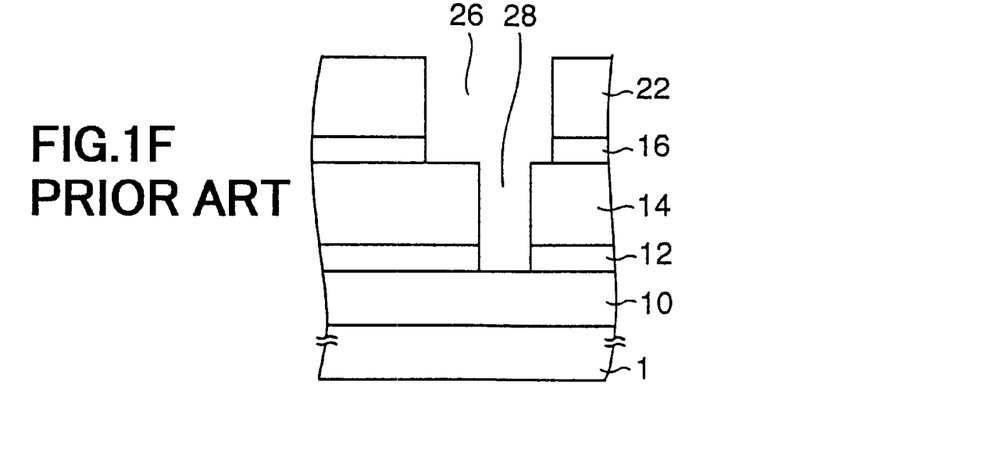

Next, in the step of FIG. 1F, the SiN film 12 exposed at the bottom part of the contact hole 28 is removed by an etching process, and the interconnection groove 26 and the contact hole 28 are filled with Cu by depositing a Cu layer (not shown) on the $SiO_2$ film 22 and causing a reflowing in the Cu layer thus deposited.

By employing the dual damascene process as noted above, the interconnection groove and the contact hole are formed by a single dry etching process, and the fabrication process of the semiconductor device is facilitated substantially.

On the other hand, the foregoing multilayer interconnection structure has a drawback, due to the use of $SiO_2$ having a large dielectric constant, for the interlayer insulation film 14 or 22, in that the interconnection patterns tend to have a large stray capacitance. Thereby, the multilayer interconnection structure cannot eliminate the foregoing problem of signal transmission delay caused by the stray capacitance.

In order to overcome the foregoing problem, it is proposed to provide a multilayer interconnection structure that uses an organic interlayer insulation film having a characteristically small dielectric constant.

FIGS. 2A–2E show the process of forming such a conventional multilayer interconnection structure that uses an organic interlayer insulation film, wherein those parts corresponding to the parts described previously are designated with the same reference numerals and the description thereof will be omitted.

Figure 2A:
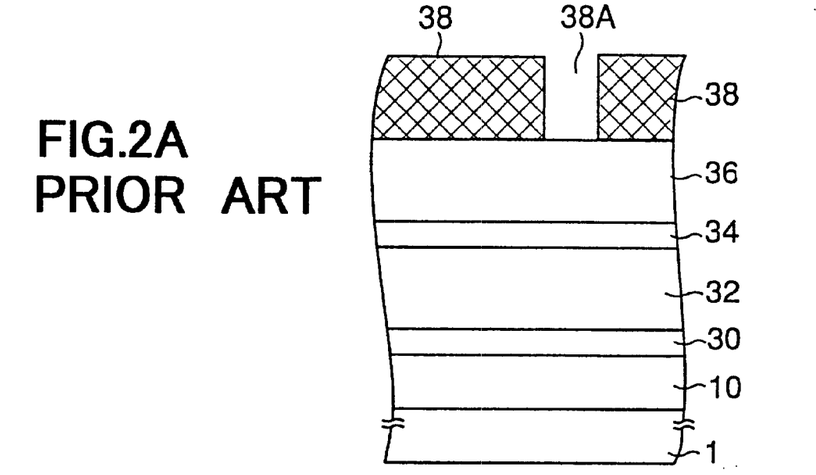
FIGS. 2A–2E are diagrams showing another example of conventional dual damascene process.

Referring to FIG. 2A, the Cu interconnection pattern 10 on the Si substrate 1 is covered by an etching stopper film 30 of SiN formed by a plasma CVD process similarly to the multilayer interconnection structure explained above, except that the etching stopper film 30 carries thereon an organic SOG film 32 formed by a spin coating process as the first interlayer insulation film. Further, a second etching stopper film 34 of SiN is formed on the organic SOG film 32 by a plasma CVD process and another organic SOG film 36 is formed on the etching stopper film 34 by a spin coating process as the second interlayer insulation film.

Figure 2B:
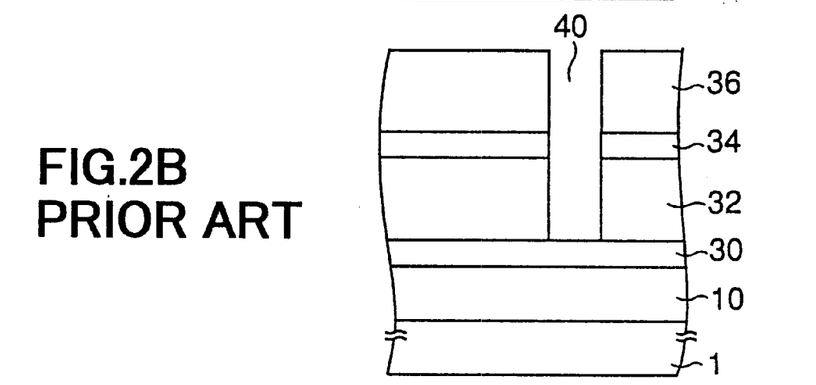

The organic SOG film 36 is then covered with a resist pattern 38 having a resist window 38A corresponding to the contact hole to be formed in the organic SOG film 32, and a step of FIG. 2B is conducted in which the organic SOG film 36, the SiN film 34 and the organic SOG film 32 are consecutively etched with a dry etching process while using the resist pattern 38 as a mask, to form a contact hole 40 exposing the SiN etching stopper film 30.

Figure 2C:
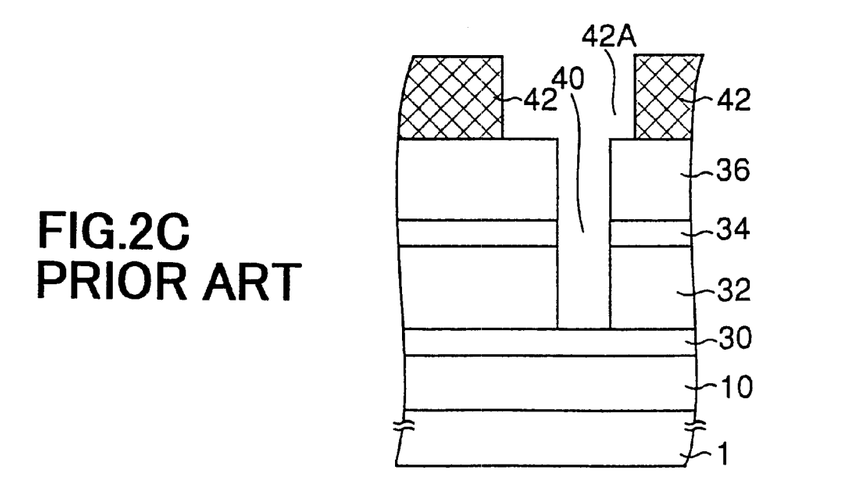
Figure 2D:
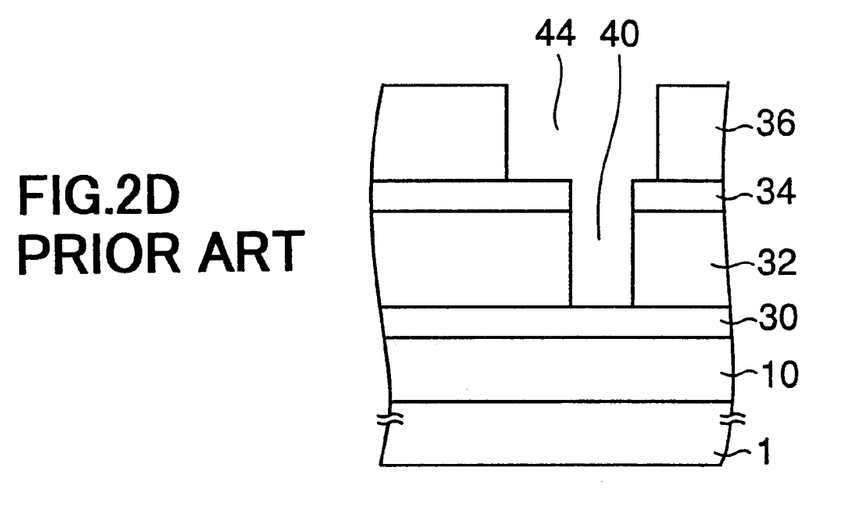

Next, in the step of FIG. 2C, the resist pattern 38 is removed and a resist pattern 42 is formed on the organic SOG film 36 such that the resist pattern 42 includes a resist window 42A exposing the foregoing contact hole 40 formed in the step of FIG. 2B. Further, by applying a dry etching process to the organic SOG film 36 in the step of FIG. 2D while using the resist pattern 42 as a mask, there is formed an interconnection groove 44 in the organic SOG film 36 in correspondence to the resist window 42A such that the SiN film 34 is exposed at the bottom of the interconnection groove 44.

Figure 2E:
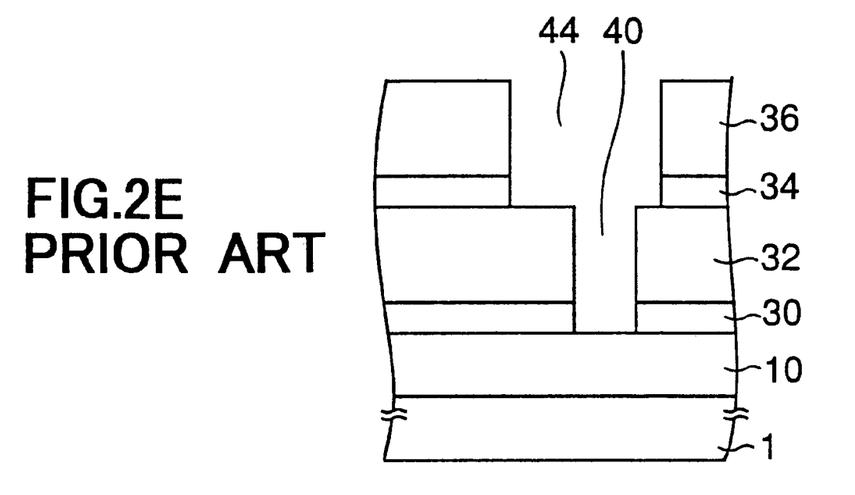

After removing the resist pattern 42 by an ashing process, the SiN film 34 is removed from the bottom of the interconnection groove 44 by an etching process. Simultaneously, the SiN film 30 at the bottom of the contact hole 40 is removed, and Cu interconnection pattern 10 on the substrate 1 is exposed at the contact hole 40.

In the latter process explained with reference to FIGS. 2A–2E, the process of forming the contact hole 40 and the process of forming the interconnection groove 44 are conducted separately by using respective mask processes.

The organic interlayer insulation films 32 and 36 explained with reference to FIGS. 2A–2E are applicable also to the process of FIGS. 1A–1F. Further, the inorganic interlayer insulation films 14 and 22 explained with reference to FIGS. 1A–1F can be used also in the process of FIGS. 2A–2E.

Figure 3A:
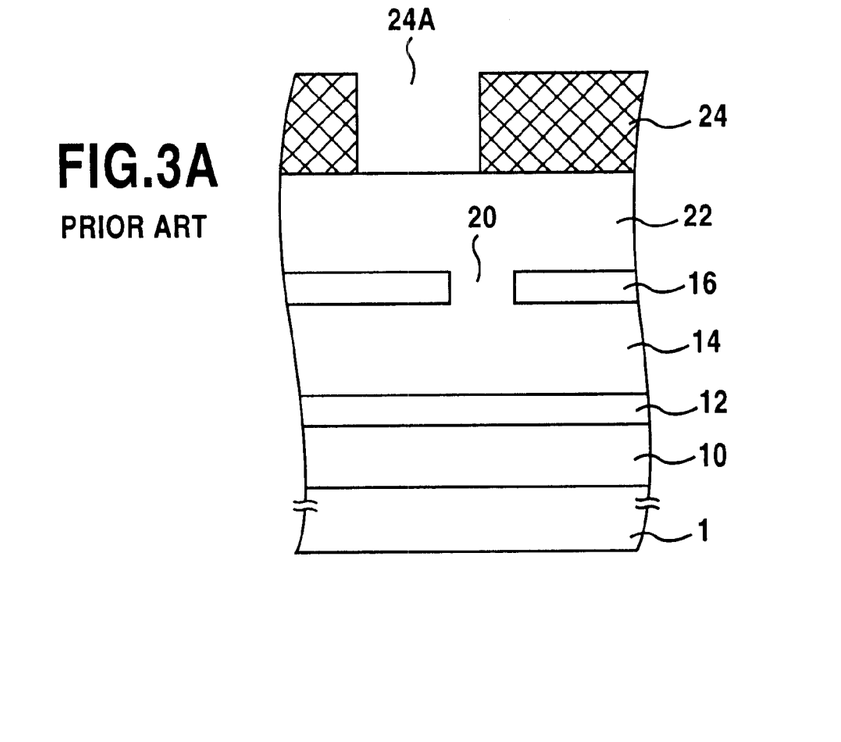
FIGS. 3A and 3B are diagrams explaining the problem pertinent to the conventional dual damascene process.

On the other hand, the conventional multilayer interconnection structure using therein the organic interlayer insulation film suffers from the problem, when there arises a misalignment in the resist pattern 24 as represented in FIG. 3A, in that the opening 20 is not included, or only partly included, in the interconnection groove 26 formed in the $SiO_2$ film 22.

Figure 3B:
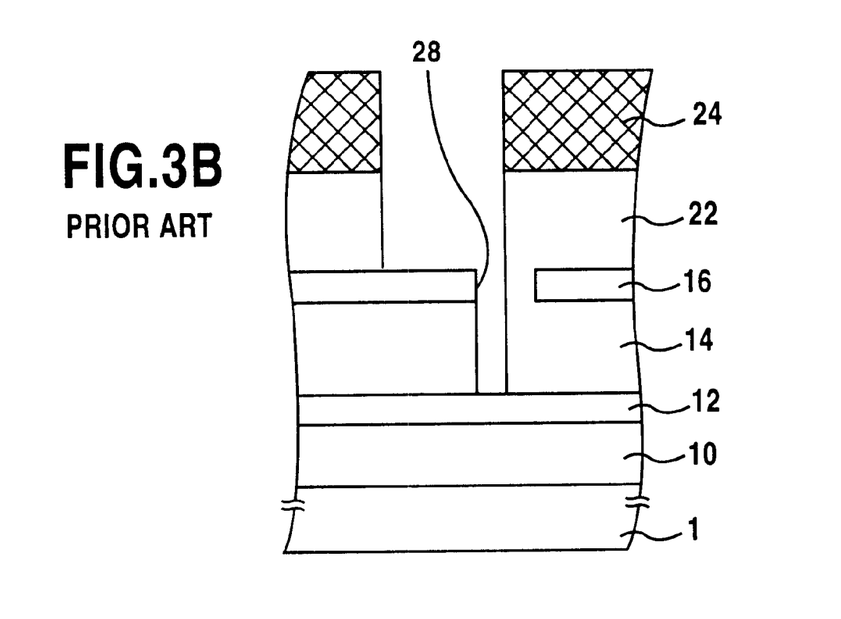

When a dry etching process is conducted in the state of FIG. 3A to form the contact hole 28 without correcting the resist pattern 24, the contact hole 28 thus formed may have a size substantially smaller than the designed size as represented in FIG. 3B. Alternatively, no contact hole may be formed at all. A similar problem arises also in the multilayer interconnection structure of FIGS. 2A–2E.

When such a misalignment is caused in the resist pattern 24, the resist pattern 24 can be corrected by simply dissolving the defective resist pattern 24 into a solvent and providing a new resist pattern 24. This correction of the resist pattern is achieved easily and without problem when the interlayer insulation film 22 is formed of an inorganic material such as $SiO_2$.

When the interlayer insulation film 22 is formed of a low-dielectric, organic SOG as in the case of FIGS. 2A–2E, on the other hand, such a correction of the resist pattern raises a problem explained hereinafter with reference to FIGS. 4A–4D.

Figure 4A:
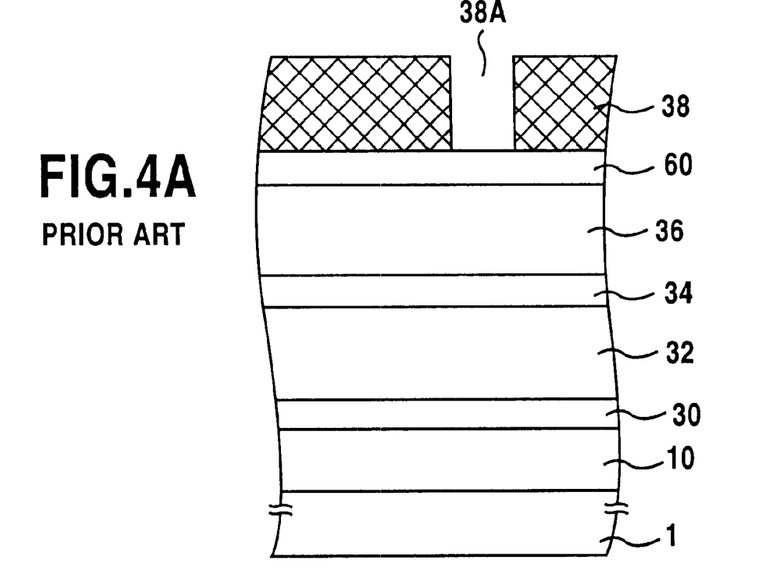
FIGS. 4A–4D are diagrams explaining the problem pertinent to the conventional dual damascene process.
Figure 4B:
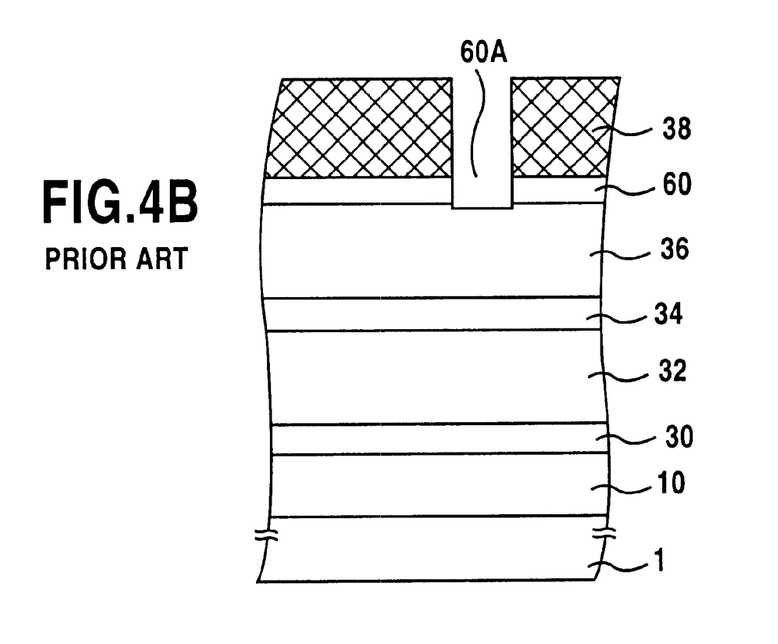

Referring to FIG. 4A, the resist pattern 38 is formed on an $SiO_2$ film 60 covering the organic SOG film 36, and an opening 60A is formed in the step of FIG. 4B in the $SiO_2$ film 60 while using the resist pattern 38 as a mask, such that the opening 60A corresponds to the resist window 38A.

Figure 4C:
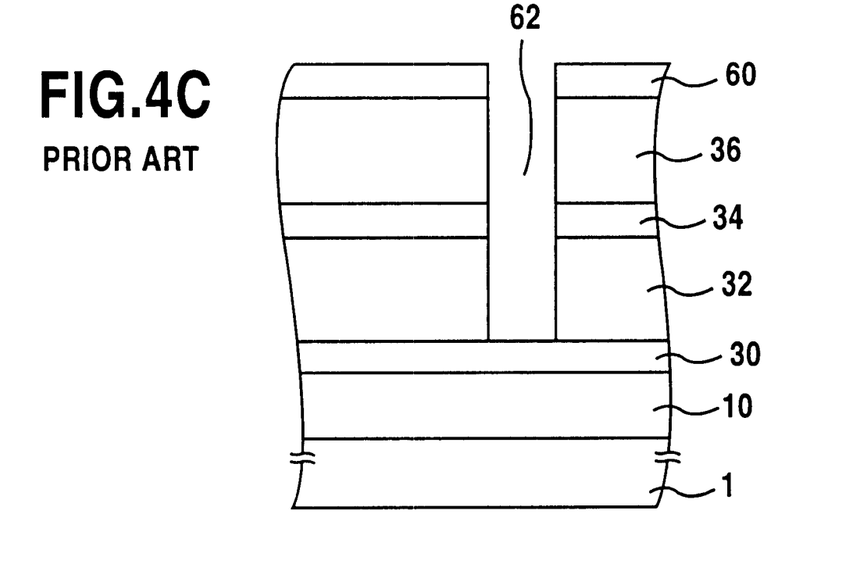

Next, in the step of FIG. 4C, the resist pattern 38 is removed and a contact hole 62 is formed in the SOG films 36 and 32, such that the contact hole 62 extends through the organic SOG films 36 and 32 and further through the intervening SiN film 34.

Figure 4D:
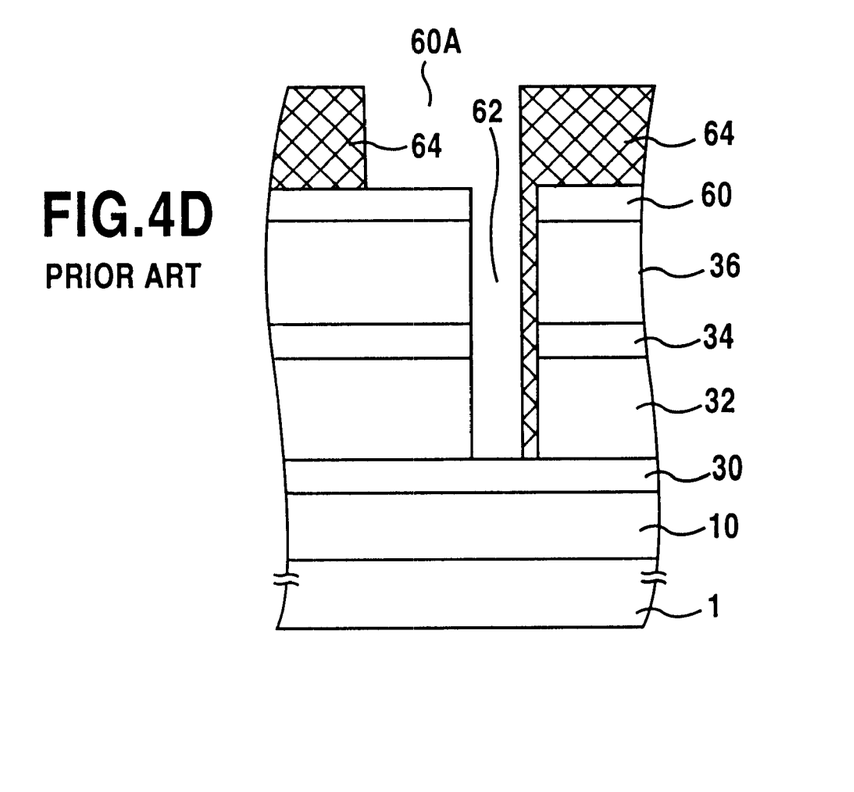

After the step of FIG. 4C, the step of FIG. 4D is conducted in which a resist pattern 64 having a resist window 64A is formed on the $SiO_2$ film 60 such that the resist window 64A exposes the contact hole 62, wherein the resist window 64A formed in the step of FIG. 4D may have a positional error such that the resist pattern 64 cover the contact hole 62 completely or partially, similarly to the case of FIGS. 3A and 3B.

When the resist window 64A of the resist pattern 64 has a positional offset as represented in FIG. 4D, it is necessary to remove the resist pattern 64 by an ashing process for re-deposition and patterning of the resist pattern 64. However, because of the fact that the organic SOG film 36 is exposed at the side wall of the contact hole 62 in the structure of FIGS. 4C or 4D, such a removal of the resist pattern 64 would inevitably cause an erosion in the organic SOG film 36 in correspondence to the contact hole 62. In other words, it has not been possible to re-form the resist pattern 64 when there is an error in the position of the resist window 64A. Thereby, it has been difficult to increase the yield of production of the semiconductor device.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having an organic interlayer insulation film in a multilayer interconnection structure and a fabrication process thereof, wherein the correction is possible for the resist pattern during a damascene process used for forming the multilayer interconnection structure.

Another object of the present invention is to provide a fabrication process of a semiconductor device, comprising the steps of:

forming a first interlayer insulation film on a substrate;

forming a second, organic interlayer insulation film on said first interlayer insulation film;

forming a first etching stopper film on said second interlayer insulation film;

forming a second, different etching stopper film on said first etching stopper film;

forming a first opening in said second etching stopper film so as to expose said first etching stopper film;

forming a second opening in a part of said first etching stopper film exposed by said first opening;

forming a third opening in said second interlayer insulation film in correspondence to said second opening by applying an etching process while using said first etching stopper film as a mask;

forming an interconnection groove in said second interlayer insulation film in correspondence to said first opening by applying an etching process while using said second etching stopper film as a mask;

forming a contact hole in said first insulation film in correspondence to said third opening; and filling said contact hole and said interconnection groove by a conductive material.

According to the present invention, the problem of signal transmission delay in the multilayer interconnection structure is successfully avoided by using an organic interlayer insulation film of the multilayer interconnection structure. Further, the present invention enables a removal and re-formation of the resist pattern during the process of forming the multilayer interconnection structure, by covering the organic interlayer insulation film by the first and second etching stopper films. Thereby, the yield of production of the semiconductor device is improved substantially.

Other objects and further features of the present invention will become apparent from the following detailed description when read in conjunction with the attached drawings.

DETAILED DESCRIPTION OF THE PREFERRED EMBODIMENTS

[First Embodiment]

FIGS. 5A–5I show the fabrication process of a semiconductor device according to a first embodiment of the present invention.

Figure 5A:
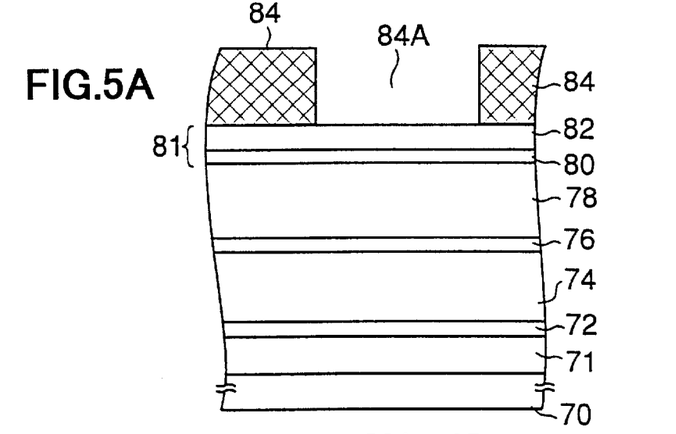
FIGS. 5A–5I are diagrams showing the fabrication process of a semiconductor device according to a first embodiment of the present invention.

Referring to FIG. 5A, a substrate 70 carries thereon a first-layer conductor pattern 71 of Cu with an insulation film (not illustrated) interposed between the conductor pattern 71 and the substrate 70. The interconnection pattern 71, in turn, is covered by a barrier layer 72 of SiN formed by a plasma CVD process with a thickness of about 30 nm.

The barrier layer 72, on the other hand, is covered by an organic SOG film 74 formed as a first interlayer insulation film by a spin-coating process with a thickness of about 700 nm, and another insulation film 76 of $SiO_2$ is formed on the first interlayer insulation film 74 by a plasma CVD process with a thickness of about 20 nm. The insulation film 76 may also be formed of an SiN film, an SiON film or an SiC film.

Further, another organic SOG film 78 is formed on the insulation film 76 as a second interlayer insulation film by a spin-coating process with a thickness of about 400 nm, and an etching stopper structure 81, formed of a stacking of two etching stopper layers, is provided on the second interlayer insulation film 78. More specifically, the etching stopper structure 81 includes a first etching stopper film 80 of SiN formed on the second interlayer insulation film 78 with a thickness of about 20 nm and a second etching stopper film 82 of $SiO_2$ formed on the first etching stopper film 80 with a thickness of about 100 nm. The etching stopper film 80 and the etching stopper film 82 may be formed by a plasma CVD process.

After the formation of the etching stopper film 82, a resist pattern 84 having a resist window 84A corresponding to the interconnection groove to be formed in the organic SOG film 78, is formed on the etching stopper film 82.

Alternatively, the etching stopper film 80 may be formed of SiON and the etching stopper film 82 may be formed of $SiO_2$. Further, any of $SiO_2$, SiON, SiN and SiON may be used for the etching stopper film 80 in combination with the etching stopper film 82 of amorphous silicon. Further, any of $SiO_2$, SiON, SiN and SiON may be used for the etching stopper film 80 in combination with the etching stopper film 82 of TiN. Further, in any of the foregoing examples, it is possible to form the etching stopper film 80 as a stacking of an $SiO_2$ film and an SiC film. The etching stopper films 80 and 82 are preferably formed by a plasma CVD process, although other suitable process may also be used for this purpose.

Next, in the step of FIG. 5B, the etching stopper film 82 is subjected to a dry etching process conducted in an etching gas of $CF_4$ and Ar while using the resist pattern 84 as a mask, and the resist pattern 84 is removed subsequently by an ashing process. As a result of the foregoing patterning of the etching stopper film 82, there is formed an opening 82A in the etching stopper film 82 in correspondence to the resist window 84A, wherein the foregoing opening 82A exposes the etching stopper film 80 underlying the etching stopper film 82.

Figure 5B:
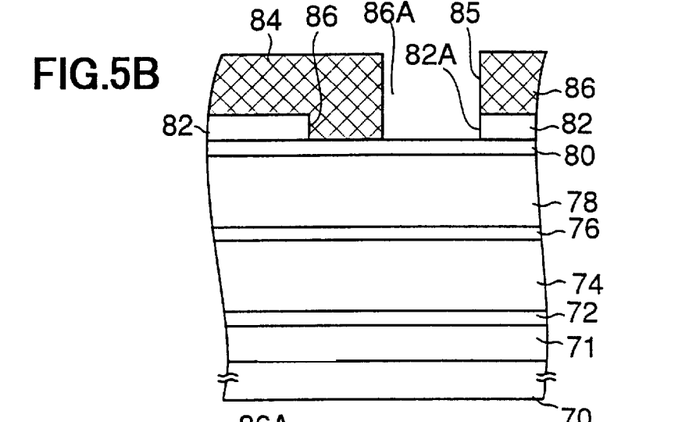

In the step of FIG. 5B, another resist pattern 86 having a resist window 86A corresponding to the contact hole to be formed in the organic SOG film 74, is formed, after the removal of the resist pattern 84, on the etching stopper film 82 so as to cover the part of the etching stopper film 80 exposed by the opening 82A, such that the resist window 86A is formed inside the opening 82A.

In the foregoing process of forming the resist pattern 86, it is necessary to align the exposure mask within the precision of several microns or less in order to ensure that the resist window 86A is formed inside the foregoing opening 82A, while the alignment of the exposure mask with such a precision is generally difficult. Thus, there is a substantial possibility that the resist window 86A is located outside the opening 82A as represented in FIG. 5C.

Figure 5C:
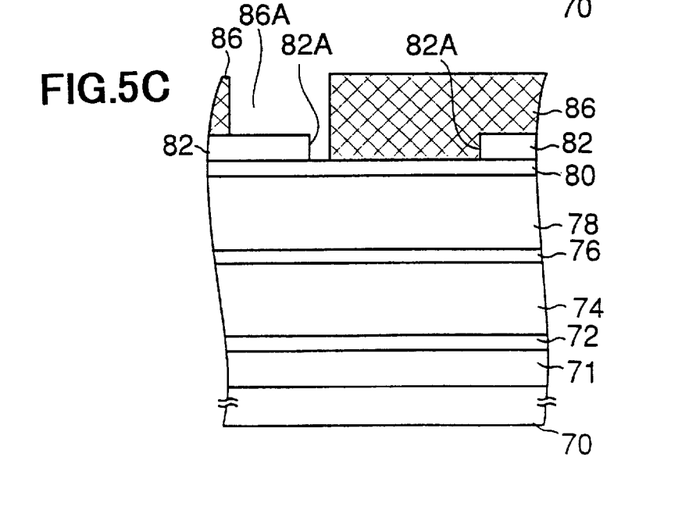

When the position of the resist opening 86A is offset to the region outside the opening 82A as represented in FIG. 5C, it is necessary to remove the resist pattern 86 and re-form the resist pattern 86 again, wherein the removal of the resist pattern 86 is typically conducted by an ashing process.

In the present embodiment, it should be noted that such a removal of the resist pattern 86 is conducted without problem as the organic SOG film 78 is protected by the etching stopper film 80, and the problem pertinent to the conventional multilayer interconnection structure, which uses the organic interlayer insulation film, in that a part of the organic interlayer insulation film such as the organic SOG film 78 or 74 is removed together with the resist pattern 86, is effectively avoided.

Figure 5D:
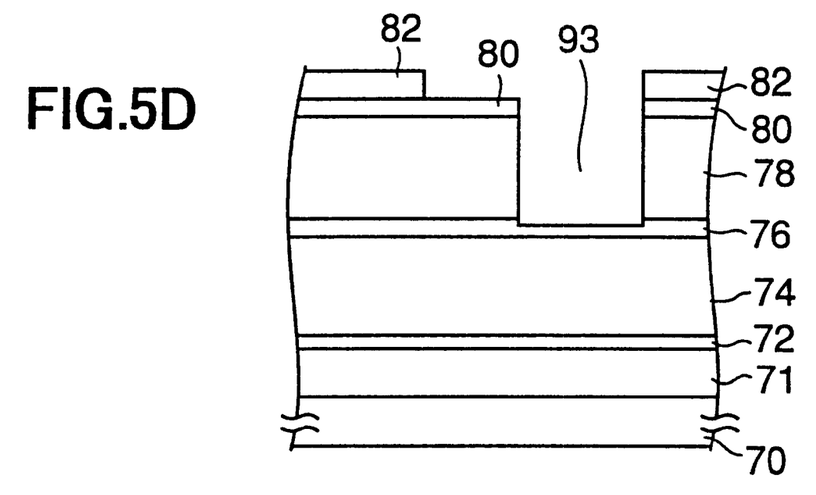

Next, in the step of FIG. 5D, the etching stopper film 80 is subjected to a patterning process while using the resist pattern 86 of FIG. 5B as a mask, followed by a dry etching process of the underlying organic SOG film 78 while using a mixture of $O_2$ and $N_2$ as an etching gas, to form an opening 93 in the organic SOG film 78. After the formation of the opening 93, the resist pattern 86 is removed by an ashing process.

Figure 5E:
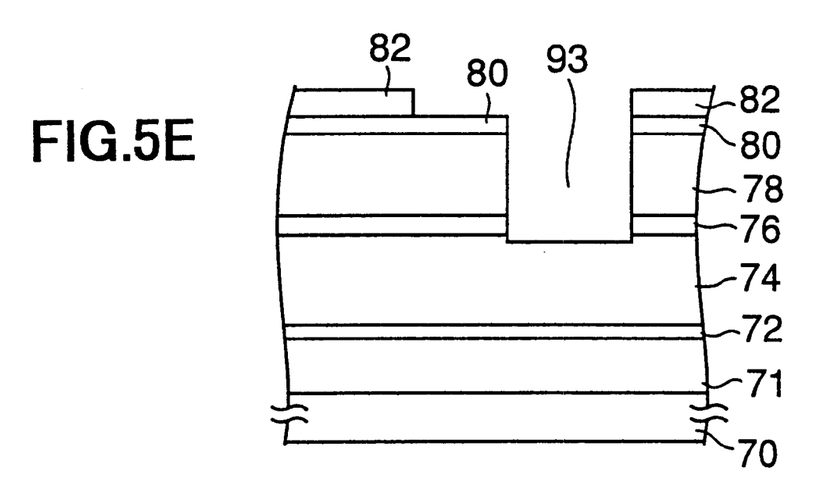

Next, in the step of FIG. 5E, the etching stopper film 80 thus exposed by the opening 82A is removed by a dry etching process conducted by a mixture of $CF_4$ and Ar while using the etching stopper film 82 as a mask, wherein the dry etching process removes simultaneously the SiN film 76 exposed at the bottom of the opening 93. It should be noted that the etching stopper film 82 has been formed with a thickness of typically about 100 nm such that the film 82 remains during the dry etching process.

Figure 5F:
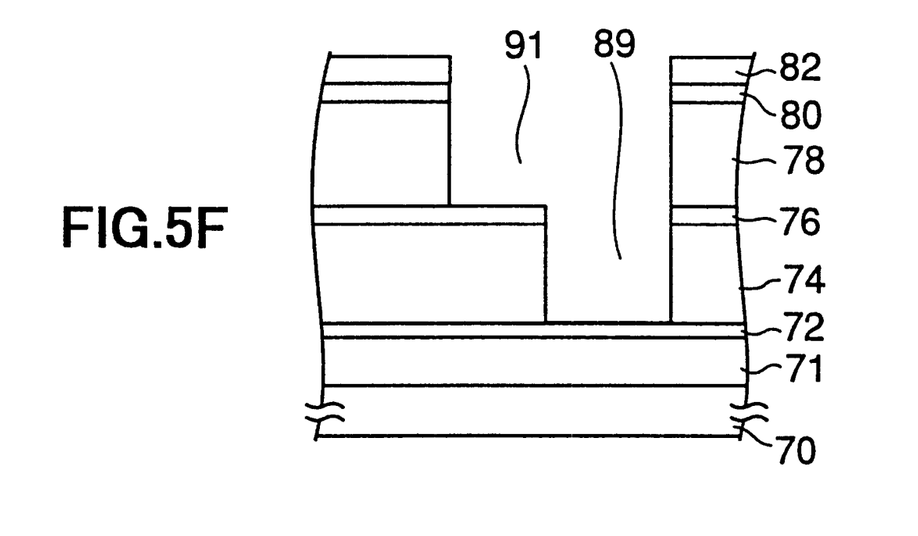

Next, in the step of FIG. 5F, the second organic SOG film 78 and the first organic SOG film 74 are patterned by a dry etching process conducted in an etching gas mixture of $O_2$ and $N_2$ while using the remaining etching stopper film 82 as a mask, to form an interconnection groove 91 and a contact hole 89 simultaneously. In this patterning process, it should be noted that the $SiO_2$ film 76 exposed at the bottom of the interconnection groove 91 functions as a hard mask during the etching process of forming the contact hole 89.

Figure 5G:
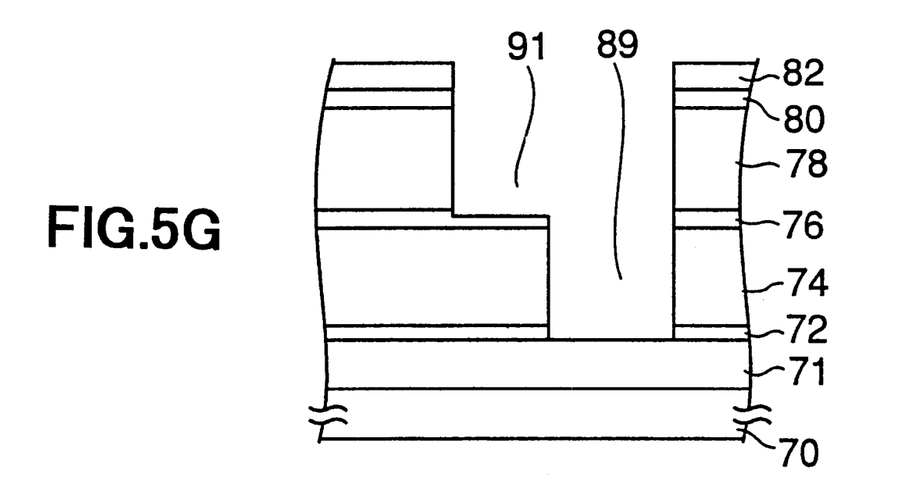
Figure 5H:
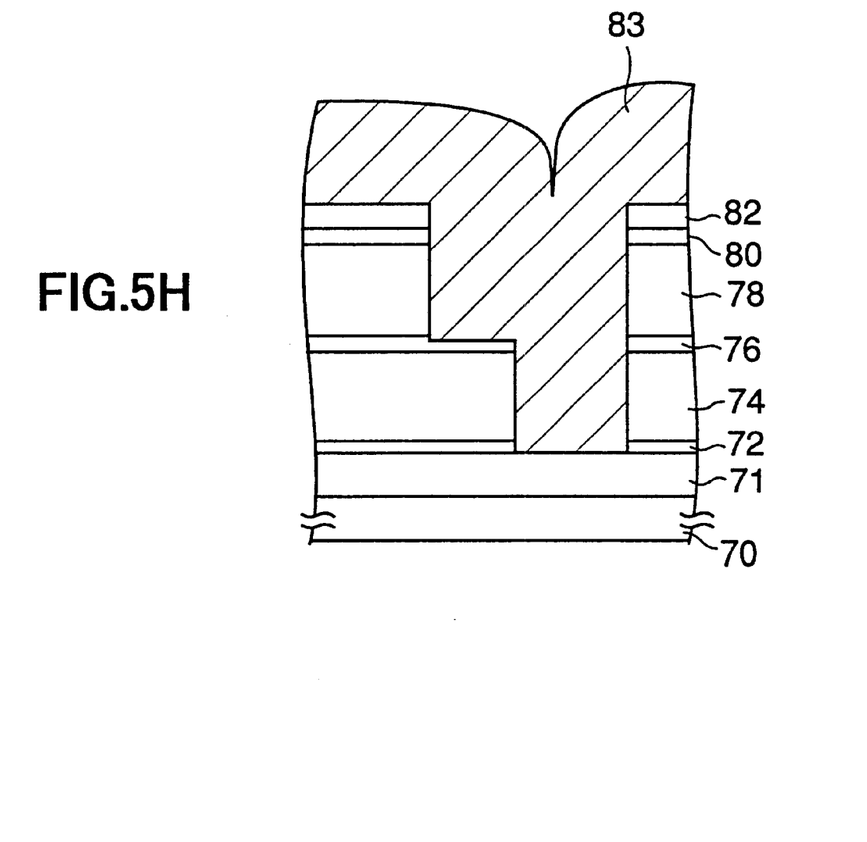
Figure 5I:
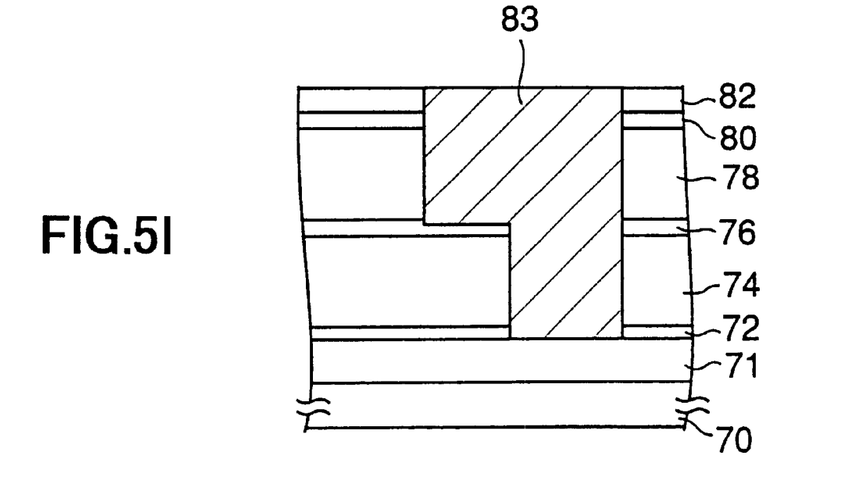

Next, in the step of FIG. 5G, the barrier layer 72 exposed at the bottom of the contact hole 89 is removed by a dry etching process conducted by using a mixture of $CF_4$ and Ar as an etching gas, followed by the step of FIG. 5H in which a Cu layer 83 is deposited on the structure of FIG. 5G by a CVD process so as to fill the contact hole 89 and the interconnection groove 91. Further, the Cu layer 83 is subjected to a CMP process in the step of FIG. 5I for removing the Cu layer 83 for the part locating above the etching stopper film 82, and a Cu pattern is obtained such that the Cu pattern fills the interconnection groove 91 and the contact hole 89.

According to the present embodiment, it is possible, in the process of forming an interconnection groove and a contact hole in a layered structure including organic SOG films by a dual damascene process, to remove the resist pattern 86 when the resist pattern 86 is defective, by covering the organic SOG film by the etching stopper films 80 and 82. Thereby, the yield of production of the semiconductor device is improved substantially.

In the present embodiment, it is also possible to use a low-dielectric insulation film such as F-doped $SiO_2$ for the lower interlayer insulation film 74.

Further, the etching stopper structure 81 may include three or more layers of $SiO_2$, SiN or SiC.

In the step of FIG. 5H, it should be noted that the deposition of the Cu layer 83 is possible also by an electroplating process. In this case, a thin Cu film is deposited by a sputtering process so as to cover the inner surface of the contact hole 89 and the interconnection groove 91 and cause a growth of the Cu layer 83 in an electrolytic solution while using the thin Cu film as an electrode.

[Second Embodiment]

Next, the fabrication process of a semiconductor device according to a second embodiment of the present invention will be described with reference to FIGS. 6A and 6B, wherein those parts of FIGS. 6A and 6B corresponding to the parts described previously are designated by the same reference numerals and the description thereof will be omitted.

Figure 6A:
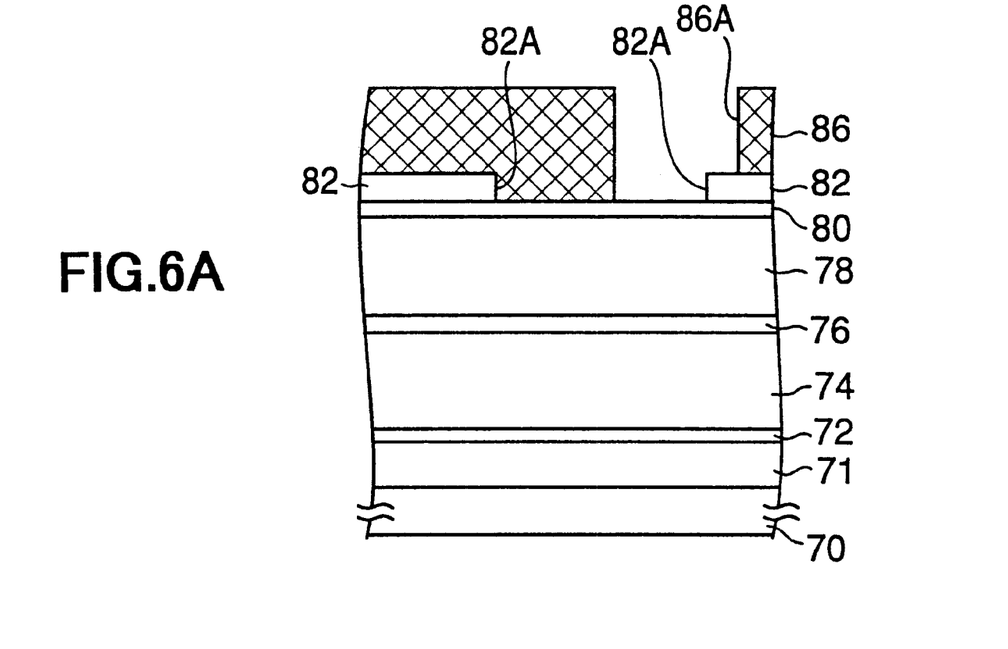
FIGS. 6A and 6B are diagrams showing the fabrication process of a semiconductor device according to a second embodiment of the present invention.
Figure 6B:
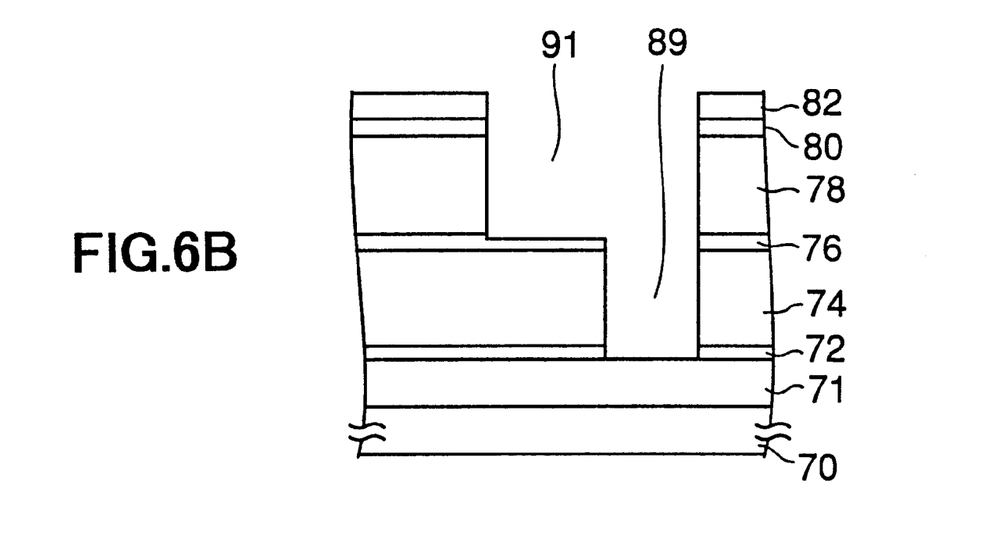

FIG. 6A corresponds to the step of FIG. 5B explained previously.

Referring to FIG. 6A, it can be seen that the resist pattern 86 is intentionally displaced with respect to the opening 82A such that the resist window 86A includes an edge part of the opening 82A formed in the etching stopper film 82. Thereby, the size of the contact hole 89 formed as a result of the etching process of FIG. 6B is reduced as compared with the size of the resist window 86A.

It should be noted that such a displacement of the resist pattern 86 for forming extremely minute contact holes raises the problem of the contact hole may not be resolved when there is a minute error in the position of the resist pattern 86, as explained with reference to FIGS. 3A and 3B. Even in such a case, the present embodiment allows a free removal of the defective resist pattern 86 and a re-formation. Thus, the problem of decrease of production yield of the semiconductor device is successfully avoided.

In any of the foregoing embodiments, it is also possible to use an amorphous fluorocarbon film having a formula for the interlayer insulation films 74 and 78 in place of the organic SOG described previously. It should be noted that such an amorphous fluorocarbon film has a dielectric constant of typically 2.4–2.7 and can be formed by a CVD process.

Further, the present invention is not limited to the embodiments described heretofore, but various variations and modifications may be made without departing from the scope of the invention.

What is claimed is:

1. A semiconductor device, comprising:
   a substrate;
   a first insulation film formed over said substrate;
   a second insulation film of an organic material formed over said first interlayer insulation film;
   a contact hole formed on said first insulation film;
   an interconnection groove formed in said second insulation film in continuation with said contact hole;
   a conductor pattern filling said contact hole and said interconnection groove;
   a first etching stopper film formed on said second interlayer insulation film; and
   a second etching stopper film having a composition different from a composition of said first etching stopper film, said second etching stopper film being formed on said first etching stopper film.

2. A semiconductor device as claimed in claim 1, wherein said second etching stopper film and said conductor pattern form a substantially flush surface.

3. A semiconductor device as claimed in claim 1, wherein said first insulation film comprises an organic material.

* * * * *